US012660365B2

(12) United States Patent
Dupre et al.

(10) Patent No.: US 12,660,365 B2
(45) Date of Patent: Jun. 16, 2026

(54) METHOD FOR MANUFACTURING, BY DIFFERENTIATED ELECTROCHEMICAL POROSIFICATION, A GROWTH SUBSTRATE INCLUDING MESAS HAVING VARIOUS POROSIFICATION LEVELS

(71) Applicant: COMMISSARIAT À L'ÉNERGIE ATOMIQUE ET AUX ÉNERGIES ALTERNATIVES, Paris (FR)

(72) Inventors: Ludovic Dupre, Grenoble (FR); Amélie Dussaigne, Grenoble (FR); Carole Pernel, Grenoble (FR); Fabian Rol, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 364 days.

(21) Appl. No.: 18/522,975

(22) Filed: Nov. 29, 2023

(65) Prior Publication Data

US 2024/0186444 A1 Jun. 6, 2024

(30) Foreign Application Priority Data

Dec. 2, 2022 (FR) ...................................... 2212704

(51) Int. Cl.
H10F 71/00 (2025.01)
H10F 77/124 (2025.01)
(Continued)

(52) U.S. Cl.
CPC ....... H10F 71/137 (2025.01); H10F 71/1274 (2025.01); H10F 77/12485 (2025.01); H10H 20/01 (2025.01); H10H 20/0137 (2025.01);

*H10H 20/018* (2025.01); *H10H 20/813* (2025.01); *H10H 20/815* (2025.01); *H10H 20/82* (2025.01); *H10H 29/142* (2025.01)

(58) Field of Classification Search
CPC .......... H10F 71/1274; H10F 77/12485; H10H 20/0137; H10H 20/813; H10H 20/815; H10H 20/82; H10H 20/01; H10H 20/018
See application file for complete search history.

(56) References Cited

U.S. PATENT DOCUMENTS

2021/0193870 A1    6/2021  Pernel et al.
2021/0193873 A1    6/2021  Pernel et al.
(Continued)

FOREIGN PATENT DOCUMENTS

DE      102020128679      5/2022
EP         3840016 A1     6/2021
EP         3840065 A1     6/2021

OTHER PUBLICATIONS

Search Report for FR2212704 dated Aug. 14, 2023.
(Continued)

*Primary Examiner* — David Vu
*Assistant Examiner* — Brandon C Fox
(74) *Attorney, Agent, or Firm* — Chrisman Gallo Tochtrop LLC

(57) ABSTRACT

A method for manufacturing a growth substrate, including producing mesas based on GaN having various porosification levels, implementing differentiated steps of electrochemical porosification, non-photoassisted and photoassisted, of various portions of the mesas.

13 Claims, 6 Drawing Sheets

(51) Int. Cl.

| | |
|---|---|
| *H10H 20/01* | (2025.01) |
| *H10H 20/813* | (2025.01) |
| *H10H 20/815* | (2025.01) |
| *H10H 20/82* | (2025.01) |
| *H10H 29/14* | (2025.01) |

(56) References Cited

U.S. PATENT DOCUMENTS

| | | | |
|---|---|---|---|
| 2022/0285584 A1 | 9/2022 | Khoury et al. | |
| 2024/0030275 A1* | 1/2024 | Avramescu | H10H 20/812 |
| 2024/0297204 A1* | 9/2024 | Dussaigne | H10H 20/817 |
| 2026/0006935 A1* | 1/2026 | Simon | H10F 55/00 |

OTHER PUBLICATIONS

Griffin, PH and Oliver, RA Porous nitride semiconductors reviewed, J. Phys. D: Appl. Phys. 53 (2020) 383002.

Toguchi, Masacika et al. "Anisotropic Electrochemical Etching of Porous Gallium Nitride by Sub-Bandgap Absorption Due to Franz-Keldysh Effect", J. Electrochem. Soc. 2019, 166, H510.

Griffin, PH et al. "Porous nitride semiconductors reviewed", J. Phys. D: Appl. Phys. 53 (2020) 383002 pp. 1-18.

* cited by examiner

METHOD FOR MANUFACTURING, BY DIFFERENTIATED ELECTROCHEMICAL POROSIFICATION, A GROWTH SUBSTRATE INCLUDING MESAS HAVING VARIOUS POROSIFICATION LEVELS

CROSS-REFERENCE TO RELATED APPLICATIONS

This application claims priority from French Patent Application No. 2212704 filed on Dec. 2, 2022. The content of this application is incorporated herein by reference in its entirety.

TECHNICAL FIELD

The field of the invention is that of methods for manufacturing a growth substrate including mesas for producing a matrix of diodes adapted to emit or detect, natively, light radiation at various wavelengths.

PRIOR ART

Methods exist for manufacturing a matrix of light-emitting diodes adapted to emit, natively, light radiation at various wavelengths. The matrix of diodes can then include diodes adapted to emit a red light, other diodes a green light, and finally others a blue light. Such a matrix of diodes then forms a microscreen with native RGB (standing for Red, Green, Blue) emission.

The diodes are said to have native emission, in that the active zone of each diode emitting at a given wavelength differs from the active zones of the diodes emitting at another wavelength. In the case of diodes produced from InGaN, the active zones differ from one another through the proportion of indium in the quantum wells.

Such a matrix of native-emission diodes is thus distinguished from colour-conversion technologies where the diodes all emit at the same wavelength, for example in the blue, and are each covered with a pad including luminophores, for example semiconductor nanocrystals forming quantum boxes, to at least partially convert the incident light into a light of another wavelength.

To manufacture a matrix of native-emission diodes, one approach consists in using a growth substrate having mesas having been partly made porous during an electrochemical porosification step. This electrochemical porosification technique is presented in particular in the article by Griffin and Oliver entitled Porous nitride semiconductors reviewed, J. Phys. D: Appl. Phys. 53 (2020) 383002.

The document EP3840065A1 describes an example of a method for manufacturing a growth substrate and then a matrix of diodes using the electrochemical porosification technique. The method includes producing a growth substrate (also called pseudo-substrate) having a plurality of mesas made of InGaN, each formed by a doped portion of InGaN made porous during an electrochemical porosification step, and an InGaN epitaxial regrowth portion not intentionally doped or weakly doped so that it is not porosified (it remains integral or dense, and therefore non-porous). The diodes are next produced by epitaxy from epitaxial regrowth portions.

The doped portions of the mesas can have different doping levels from one mesa to another, so that the mesas have different porosification levels and therefore different degrees of relaxation. The diodes produced from the various mesas then include quantum wells having a greater or lesser proportion of indium, thus making it possible to obtain emissive pixels at various wavelengths.

However, to obtain mesas the doped InGaN layers of which have various doping levels from one mesa to another, it is necessary to implement, before the step of producing the mesas, a step of spatially localised implantation of dopants in a full plate InGaN layer, which makes the manufacturing method more complex.

DESCRIPTION OF THE INVENTION

The objective of the invention is to at least partly remedy the drawbacks of the prior art, and more particularly to propose a method for manufacturing a growth substrate, adapted to producing a matrix of diodes based on InGaN, including mesas having various porosification levels, without its being necessary to implement spatially localised implantations of dopants.

For this purpose, the object of the invention is a method for manufacturing a growth substrate adapted to produce by epitaxy a matrix of diodes based on InGaN, including the following steps:

providing a crystalline stack based on GaN, including: a doped bottom layer; and a top layer made from $In_{x2}Ga_{1-x2}N$ with x2>0, resting on and in contact with the doped bottom layer; where:

the doped bottom layer has a proportion of indium x1≥0 predefined so that it is non-adsorbent of an illumination light radiation having a predefined central wavelength, and the top layer has a proportion of indium x2>0 predefined so that it is absorbent of the illumination light radiation;

the doped bottom layer has a doping level predefined so that it is porosifiable at an electrical voltage of predefined value $V_{ECE}$, and the top layer has a doping level predefined so that it is non-porosifiable at the predefined electrical voltage $V_{ECE}$;

producing mesas $M_{(i)}$, with i ranging from 0 to 2, by localised etching of the top layer to form top portions of mesas, and of at least part of the doped bottom layer to form bottom portions of mesas; then depositing an encapsulation layer made of an electrically insulating material, covering at least one mesa denoted $M_{(0)}$, so that said mesa $M_{(0)}$ is not porosified during an electrochemical porosification of mesas denoted $M_{(1)}$ and $M_{(2)}$; then electrochemical porosification of the bottom and top portions of at least one mesa $M_{(2)}$ by: photoassisted porosification of the top portion of the mesa $M_{(2)}$ by emission of the illumination light radiation; and non-photoassisted of the bottom portion of the mesa $M_{(2)}$ by applying the electrical voltage of value $V_{ECE}$;

electrochemical porosification of only one of the bottom and top portions of at least one mesa $M_{(1)}$ by: photoassisted porosification of the top portion of the mesa $M_{(1)}$ during that of the top portion of the mesa $M_{(2)}$; or non-photoassisted porosification of the bottom portion of the mesa $M_{(1)}$ during that of the bottom portion of the mesa $M_{(2)}$;

at least partial removal of the encapsulation layer, so as to make free a top surface of the mesa $M_{(0)}$.

Some preferred yet non-limiting aspects of this manufacturing method are as follows.

The photoassisted porosification and the non-photoassisted porosification can be implemented during distinct steps.

The method can include the following distinct steps: a step of photoassisted porosification of the top portions of the mesas $M_{(1)}$ and $M_{(2)}$, the mesas $M_{(1)}$ and $M_{(2)}$ being in contact with a liquid electrolyte; and a step of non-photoassisted porosification of the bottom portion of the mesas $M_{(2)}$, the mesas $M_{(1)}$ being covered with an encapsulation layer made of an electrically insulating material, only the mesas $M_{(2)}$ being in contact with a liquid electrolyte.

In a variant, the method can include the following distinct steps: a step of photoassisted porosification of the top portion of the mesas $M_{(2)}$, the mesas $M_{(1)}$ being covered with an encapsulation layer made of an electrically insulating material, only the mesas $M_{(2)}$ being in contact with a liquid electrolyte; a step of non-photoassisted porosification of the bottom portion of the mesas $M_{(1)}$ and $M_{(2)}$, the mesas $M_{(1)}$ and $M_{(2)}$ being in contact with the liquid electrolyte.

In a variant, the photoassisted porosification and the non-photoassisted porosification can be implemented during the same step, an opaque encapsulation layer, made of a material opaque to the illumination light radiation, at least partly covering a top surface of the mesas $M_{(1)}$ while leaving free a lateral surface of the bottom portion of the mesas $M_{(1)}$.

The crystalline stack can include a continuous epitaxial regrowth layer, resting on the top layer, and made from InGaN having a proportion of indium x3>0 predefined so that it is non-absorbent of the illumination light radiation, and having a doping level predefined so that it is non-porosifiable at the predefined electrical voltage $V_{ECE}$.

The crystalline stack may not include a continuous epitaxial regrowth layer, so that the top layer has a free top face, epitaxial regrowth portions made from InGaN being produced as from a top surface of the top portions of the mesas $M_{(1)}$ after the porosification of the mesas $M_{(1)}$ and $M_{(2)}$.

During the photoassisted porosification, an electrical voltage can be applied between the growth substrate and a liquid electrolyte in which it is immersed, of a value $V_{PECE}$ predefined so that the bottom portions of the mesas $M_{(1)}$ are not porosified.

The invention also relates to a method for manufacturing an optoelectronic device, including the following steps:
  manufacturing the growth substrate by the method according to any one of the preceding features; then
  manufacturing a matrix of diodes $D_{(i)}$ by epitaxy from the mesas $M_{(i)}$ of the growth substrate, the diodes then being adapted to emit or detect a light radiation at various wavelengths, the wavelength being different from one category of mesa $M_{(i)}$ to another.

The invention also relates to a growth substrate adapted to produce by epitaxy a matrix of diodes based on InGaN, including:
  a support layer;
  mesas $M_{(i)}$, with i ranging from 0 to 2, made from crystalline GaN, resting on the support layer, and each including: a doped bottom portion having a proportion of indium x1≥0; and a top portion made from $In_{x2}Ga_{1-x2}N$ with x2>x1 and having a doping level less than that of the bottom portion, and resting on and in contact with the bottom portion; the mesas being configured so that:
    the bottom and top portions of the mesa $M_{(0)}$ are non-porous;
    only one portion among the bottom and top portions of the mesa $M_{(1)}$ is porous;
    the bottom and top portions of the mesa $M_{(2)}$ are porous.
Each mesa $M_{(i)}$ can include an epitaxial regrowth portion resting on the top portion, made from non-porous crystalline InGaN the mesh parameter $a^m_{cre}$ of the relaxed material of which is greater than the effective mesh parameter $a^e_{cs}$ of the support layer: the epitaxial regrowth portion of each mesa $M_{(2)}$ having a maximum mesh parameter $a^e_{cre(2)}$; the epitaxial regrowth portion of each mesa $M_{(0)}$ having a mesh parameter $a^e_{cre(0)}$ less than $a^e_{cre(2)}$; the epitaxial regrowth portion of each mesa $M_{(1)}$ having an intermediate mesh parameter $a^e_{cre(1)}$ less than $a^e_{cre(2)}$ and different from $a^e_{cre(0)}$.

The bottom portions of the mesas $M_{(i)}$ can rest on a continuous layer made of an electrically conductive material.

The invention also relates to an optoelectronic device (1) including: a growth substrate according to any one of the preceding features; and a matrix of diodes $D_{(i)}$ based on InGaN, epitaxed from the mesas of the growth substrate, the diodes then being adapted to emit or detect a light radiation at various wavelengths, the wavelength being different from one category of mesa $M_{(i)}$ to another.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein.

DETAILED DESCRIPTION OF PARTICULAR EMBODIMENTS

Figure 1A:
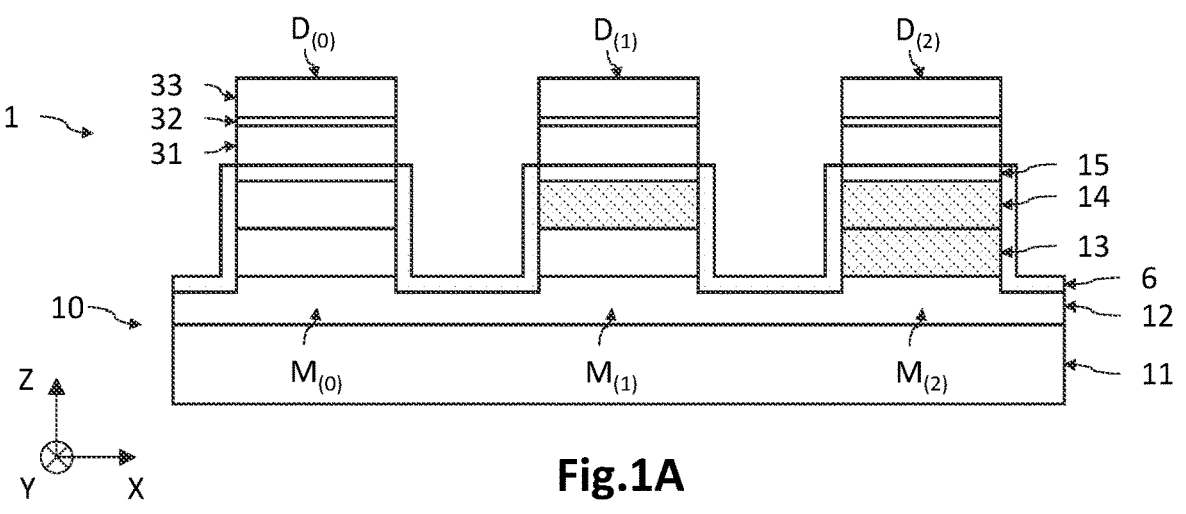
FIGS. 1A to 1C are schematic partial views, in cross section, of a growth substrate including mesas having various porosification levels, according to various variant embodiments, and a matrix of diodes based on InGaN epitaxed from the growth substrate.

In the figures and in the remainder of the description, the same references represent identical or similar elements. In addition, the various elements are not shown to scale so as to promote clarity of the figures. Moreover, the different embodiments and variants are not mutually exclusive and could be combined together. Unless indicated otherwise, the terms "substantially", "approximately", "in the order of" mean within a 10% margin, and preferably within a 5% margin. Moreover, the terms "between . . . and . . . " and equivalents mean that the bounds are included, unless stated otherwise.

The invention relates to a growth substrate and the method for manufacturing same. The growth substrate is adapted to produce by epitaxy a matrix of diodes based on InGaN, the diodes making it possible to emit or detect, natively, light radiation at various wavelengths.

The growth substrate includes mesas $M_{(i)}$ with i ranging from 0 to 2, having various porosification levels $P_{(i)}$ depending on whether the bottom and top portions of the mesas are all porous (mesas denoted $M_{(2)}$), or only one of them (mesas $M_{(1)}$), or even none (mesas $M_{(0)}$). These various porosification levels $P_{(i)}$ make it possible to obtain mesas $M_{(i)}$ having different degrees of relaxation $R_{(i)}$. The degrees of relaxation $R_{(i)}$ are represented by the fact that the epitaxial regrowth portions have various values of the effective mesh parameter from one category of mesa to another. Thus the diodes $D_{(i)}$ produced during the same epitaxy step have active zones different in terms of proportion of indium incorporated in the quantum wells, from one category of diodes $D_{(i)}$ to another (and therefore of mesas) and are therefore adapted to emit or detect light radiation at various wavelengths.

It should be noted that the bottom and top portions of the mesas are in contact with each other and are not separated from each other by an intermediate isolation layer that would make it possible to porosify only one or other of said portions of the mesa. In this configuration, porosification of the bottom and top portions of the mesas is made possible by the use of a differentiated electrochemical porosification of the bottom and top portions of the mesas, by means of a photoassisted porosification of the top portion (a PECE, standing for Photo ElectroChemical Etching, porosification is then spoken of) and a non-photoassisted porosification of the bottom portion (an ECE, standing for ElectroChemical Etching, porosification is then spoken of).

For this purpose, for each mesa, the bottom portion is sufficiently doped to be porosifiable by ECE porosification for an electrical voltage applied with a predefined value $V_{ECE}$. On the other hand, the top portion is not intentionally doped or insufficiently doped so as to be non-porosifiable during ECE porosification at the electrical voltage $V_{ECE}$. Preferably, there is a difference of at least an order of magnitude, in terms of doping level, between the bottom portion and the top portion.

In addition, for each mesa, the top portion has a proportion of indium x2>0 sufficient for it to absorb the illumination light radiation of the central wavelength $\lambda_c$ emitted in the direction of the mesas during the PECE porosification. On the other hand, the bottom portion is made of a material wherein the proportion of indium x1≥0 is insufficient for it to absorb this illumination light radiation during the PECE porosification.

It should be stated that electrochemical anodising porosification is implemented by immersing the growth substrate based on crystalline GaN in a liquid electrolyte. In the context of ECE porosification, the growth substrate is connected to the anode of an electrical generator whereas a counter-electrode, immersed in the electrolyte, is connected to the cathode, in order thus to apply a predefined electrical voltage of value $V_{ECE}$.

Figure 1B:
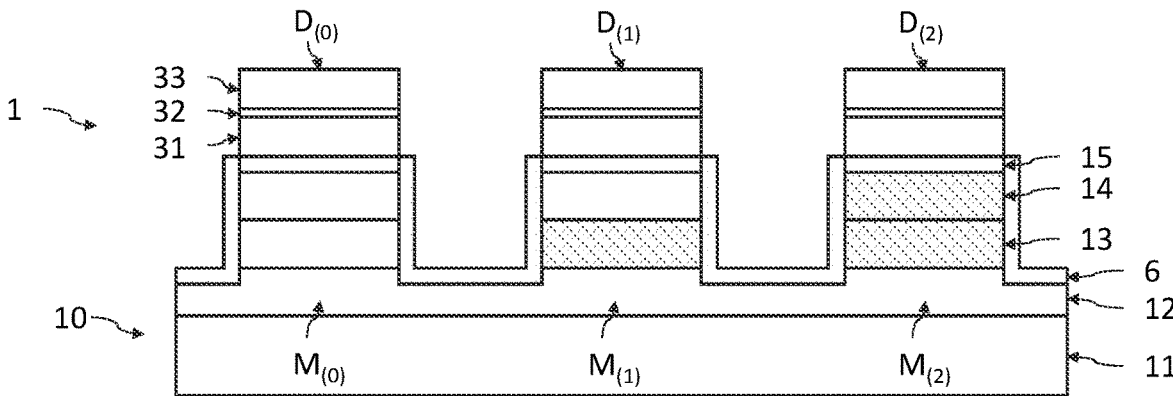
Figure 1C:
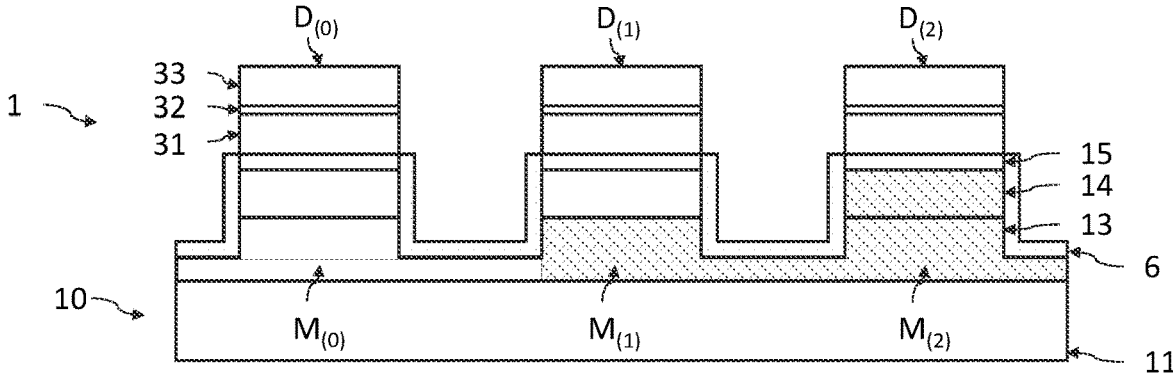

FIGS. 1A to 1C are schematic partial views, in cross section, of an optoelectronic device 1 including a growth substrate 10 and a matrix of diodes $D_{(i)}$ based on InGaN, according to various variant embodiments. FIGS. 1A and 1B illustrate variants where the mesas $M_{(i)}$ rest on the same buffer layer 12 made of a material that is non-porosifiable (at the electrical voltage of porosification of the mesas) and electrically conductive, whereas FIG. 1C illustrates a variant where such a buffer layer 12 is absent.

The optoelectronic device 1 is here a native RGB emissive microscreen, where the pitch of the diodes $D_{(i)}$ can be less than or equal to approximately 10 μm. The index i, ranging from 0 to 2, relates to the categories (presented later) of the mesas $M_{(i)}$ and therefore of the diodes $D_{(i)}$.

An orthogonal three-dimensional direct reference frame XYZ is defined here and for the following description, where the X and Y axes form a main plane of a support layer 11 and where the Z axis is oriented across the thickness of the growth substrate 10 in the direction of the diodes $D_{(i)}$.

The optoelectronic device 1 includes a growth substrate 10 from which a matrix of diodes $D_{(i)}$ has been produced by epitaxy. The electrical biasing electrodes of the diodes are not shown here for reasons of clarity.

The growth substrate 10 includes a support layer 11 and mesas $M_{(i)}$ each intended for producing, by epitaxial regrowth, a diode $D_{(i)}$ of the matrix. A mesa (i.e. an elevation, a relief) is a part of the growth substrate 10 projecting with respect to the support layer 11. The mesas are produced by localised etching of a crystalline stack 20 (cf. FIG. 3A).

The growth substrate 10 is based on crystalline GaN, i.e. it is made of GaN and/or compounds thereof such as $In_xGa_{1-x}N$, $Al_yGa_{1-y}N$, or even $In_xAl_yGa_{1-x-y}N$. In general terms, "material based on GaN" means that the material can be GaN and/or compounds thereof. It can thus be $In_xAl_yGa_{1-x-y}N$ where the proportion of indium x can be zero and where the proportion of aluminium y can also be zero. And "material based on InGaN" means that it is made of InGaN or of InAlGaN, i.e. it can be made of $In_xAl_yGa_{1-x-y}N$ where the proportion of indium x is non-zero and where the proportion of aluminium y can be zero.

The support layer 11 is here made of a non-porosifiable material, so that it remains non-porous (dense) during the porosification of the mesas. It may be a case of a material inert to the electrochemical porosification reaction, such as an insulating material (sapphire etc.) or a semiconductor material (SiC, Si etc.) not intentionally doped (nid) or weakly doped. It may also be a case of a semiconductor material based on GaN the doping level $N_D$ of which is below a minimum value $N_{D,min}(V_{ECE})$ of the electrical voltage applied during the ECE (non-photoassisted) porosification: it can then be not intentionally doped or weakly doped. Preferably, the support layer is non-porosifiable at the electrical porosification voltage of the mesas. By way of example, the support layer can be made of freestanding sapphire, silicon, SiC or GaN, among others. It has a thickness for example of between approximately 200 μm and approximately 1.2 mm. Intermediate layers can be present between the support layer 11 and the buffer layer 12, based for example on AlN. Thus, by way of examples, the following stacks can be used: Si/AlN/AlGaN/GaN; sapphire/NID GaN; SiC/AlN/AlGaN etc.

A buffer layer 12 can be present, as illustrated by FIGS. 1A and 1B. The buffer layer 12 here makes it possible to apply an electrical potential to the bottom portions 13 of the mesas $M_{(i)}$ from a biasing electrode 3 (cf. for example FIG. 3B). This is because the bottom portions 13 are here distinct from each other in the plane XY (no continuity of material of these bottom portions). For this purpose, the buffer layer 12 is made of a crystalline material based on doped GaN (here type n) over at least a part of its thickness. The buffer layer 12 is produced by epitaxy from the support layer 11. It can have a thickness of between approximately 1 and approximately 10 μm.

The buffer layer 12 can be made of a material that is non-porosifiable during the ECE and PECE porosification. It is then weakly doped to firstly allow transport of the charge carriers and secondly not to be porosifiable during ECE porosification. More precisely, it has a doping level $N_D$ below a predefined minimum value $N_{D,min}(V_{ECE})$ of the doping level $N_D$ as from which, for a value $V_{ECE}$ of electrical voltage applied during an ECE porosification, a crystalline material based on GaN is porosified. The doping level $N_D$ can be less than $10^{18}$ cm$^{-3}$ for a value $V_{ECE}$ of the electrical voltage of the order of approximately 30V. In addition, in order not to be porosifiable during PECE porosification, the buffer layer 12 has a proportion of indium insufficient to absorb the illumination light radiation. In a variant, the buffer layer 12 can be made of a material that is porosifiable during ECE biasing.

In a variant, as illustrated by FIG. 1C, the buffer layer 12 may be absent. Thus the growth substrate 10 includes a continuous bottom layer 23 from which the bottom portions 13 of the mesas $M_{(i)}$ are formed. In other words, this bottom layer 23 extends continuously in the plane XY and connects the bottom portions 13 to each other. The biasing electrode 3 then rests in contact with the bottom layer 23.

The mesas $M_{(i)}$ include two portions superimposed along the axis Z, in contact with each other, namely a bottom portion 13 located alongside the support layer 11, and a top portion 14 that rests on and in contact with the bottom portion 13. They are made of a material that is porosifiable in a differentiated manner, depending on whether it is a case of non-photoassisted electrochemical porosification ECE or photoassisted electrochemical porosification PECE. An epitaxial regrowth portion 15 based on InGaN rests on the top portion 14. It can be produced before or after the electrochemical porosification of the mesas $M_{(i)}$.

Each of the bottom 13 and top 14 portions is made of a crystalline semiconductor material based on GaN. The material can be selected from InGaN, AlGaN, InAlGaN and/or GaN. In this example, the bottom portions 13 are made of GaN and the top portions 14 are made of InGaN. They have a thickness for example of between approximately 50 nm and approximately 1 μm, here equal to approximately 800 nm. The bottom 13 and top 14 portions of one and the same mesa $M_{(i)}$ can have the same thickness or different thicknesses. The mesas $M_{(i)}$ can have been formed by one or more operations of etching an initial crystalline stack (cf. for example FIG. 3A), for example by dry etching, so that their flanks can be substantially vertical.

Figure 2:
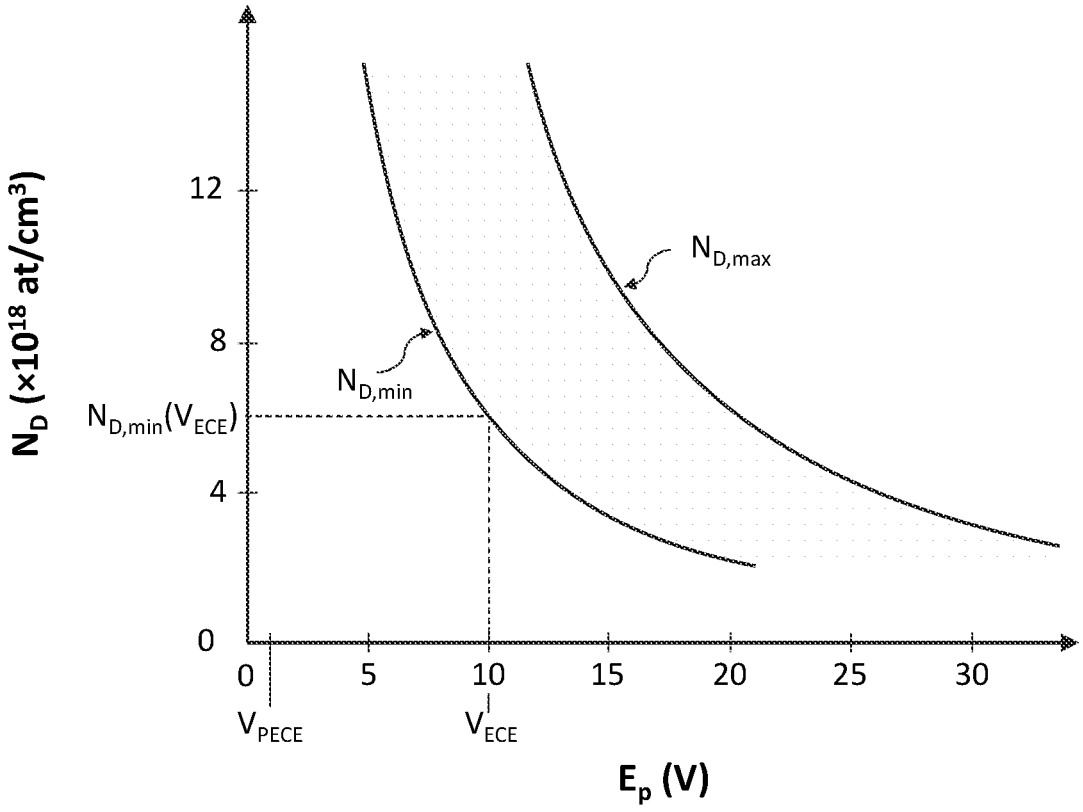
FIG. 2 illustrates an example of relationship between the doping level of a doped crystalline layer as a function of the electrical voltage applied, showing the domain of existence of the electrochemical porosification.

It should be stated here that an electrochemical porosification reaction is a selective reaction in that, for the same electrical voltage $E_p$ of value $V_{ECE}$, a doped crystalline semiconductor material based on GaN will be porosified if its doping level $N_D$ is higher than or equal to a predefined minimum doping level $N_{D,min}(V_{ECE})$. In the contrary case it will not be porosified and will remain integral (dense). In this regard, FIG. 2 illustrates an example of the domain of existence of electrochemical ossification as a function of the doping level $N_D$ (here in donors) of the distal a material based on GaN and the electrical voltage $E_p$ applied, as described in particular in the document EP3840016A1.

The minimum doping level $N_{D,min}$ depends on the value of the electrical voltage $E_p$ in accordance with a decreasing function: the higher the electrical voltage $E_p$ the lower the minimum doping level $N_{D,min}$ required for porosifying the crystalline material. In other words, for a predefined value $V_{ECE}$ of the electrical voltage $E_p$ applied during the porosification step ECE, the crystalline material having a doping level $N_D$ below the minimum value $N_{min}(V_{ECE})$ will not be porosified (made porous) and will therefore remain integral or dense (non-porous): this material can then be termed "non-porosifiable". On the other hand, this same material, when it has a doping level $N_D$ at least equal to the minimum value $N_{D,min}(V_{ECE})$, will be porosified (made porous) and can therefore be termed "porosifiable". It should be noted that the domain of existence also depends on the forbidden energy band of the material, and therefore here on the proportion of indium in the material. This is because, the higher this proportion of indium in the material, the lower the porosification potential. Thus it is preferable for the proportion of indium in the top portion 14 not to be much higher (e.g. of the order of 2%) than that of the bottom portion 13 (e.g. of the order of 0% for GaN).

Porosifying all the bottom and top portions of the mesas $M_{(i)}$, or only one of them, makes it possible to obtain a greater or lesser relaxation in the mesas $M_{(i)}$. Thus a porosified portion becomes deformable, and will allow partial or total relaxation of the non-porous top portion, whether it is a case of the top portion 14 if it is non-porous and/or of the epitaxial regrowth portion 15. Thus the growth substrate 10 can have the following characteristics:

in the mesas $M_{(2)}$ where the porosification level $P_{(2)}$ is maximum, the fact that all the bottom 13 and top 14 portions have become porous makes them deformable with respect to the mechanical stresses generated by the epitaxial regrowth portion 15, so that the latter relaxes and has an effective mesh parameter $a^e_{cre(2)}$ that can then be substantially equal to that of its solid material $a^m_{cre}$: $a^e_{cre(2)} \approx a^m_{cre}$;

in the mesas $M_{(0)}$ where the porosification level $P_{(0)}$ is minimum, as none of the bottom 13 and top 14 portions has been made porous and therefore deformable, the epitaxial regrowth portion 15 continues to be subject to the mechanical stresses generated by the support layer 11 or by the buffer layer 12 (where applicable), and therefore has an effective mesh parameter $a^e_{cre(0)}$ that can then be substantially equal (by means of a slight relaxation due to the etching of the mesa) to that of the buffer layer 12: $a^e_{cre(0)} \approx a^e_{ct}$;

in the mesas $M_{(1)}$ where the porosification level $P_{(1)}$ is intermediate, a porosified portion will therefore be made deformable and will enable the non-porous top portion (the top portion 14 and/or the epitaxial regrowth portion 15) to partly relax:

if the porous portion is the bottom portion 13 and the top portion 14 is non-porous and is made of InGaN, or if the porous portion is the top portion 14, then the epitaxial regrowth portion 15 has an effective mesh parameter $a^e_{cre(1)}$ that will be able to be greater than $a^e_{cre(0)}$. It will then be possible to have a growth substrate 10 where: $a^e_{cre(0)} < a^e_{cre(1)} < a^e_{cre(N)}$.

The bottom portions 13 of the mesas $M_{(i)}$ are made of a material that is porosifiable during non-photoassisted electrochemical porosification ECE and is non-porosifiable during photoassisted electrochemical porosification PECE.

Thus, to be porosifiable during ECE porosification in the course of which an electrical voltage $E_p$ of value $V_{ECE}$ is applied to the growth substrate 10, the material of the bottom portions 13 has a doping level $N_D$ at least equal to the minimum value $V_{D,min}(V_{ECE})$ as from which the porosification of the material takes place, for example between $3 \times 10^{18}$ cm$^{-3}$ and $1.5 \times 10^{19}$ cm$^{-3}$, for example equal to approximately $6\times10^{18}$ cm$^{-3}$. The bottom portions 13 are preferably n doped with silicon, or even with germanium, but a p doping is possible.

In addition, to be non-porosifiable during PECE porosification during which illumination light radiation with a wavelength $\lambda_c$ is emitted in the direction of the mesas, the material has a proportion of indium $x1\geq0$ such that the illumination light radiation is not absorbed. The proportion of indium $x1$ in the bottom portions 13 is such that the illumination light radiation is not absorbed, even taking into account the Franz-Keldysh effect. It is preferably lower than the proportion of indium $x2$ in the top portions 14.

Moreover, the top portions 14 of the mesas s $M_{(i)}$ are made of a material that is non-porosifiable during non-photoassisted electrochemical porosification ECE, but is porosifiable during photoassisted electrochemical porosification PECE.

Thus, to be non-porosifiable during ECE porosification, the material of the top portions 14 has a doping level $N_D$ lower than the minimum value $V_{D,min}(V_{ECE})$ as from which the porosification of the material takes place. The top portions 14 can be not intentionally doped but preferably are weakly doped, and for example have a doping level of no more than $5\times10^{17}$ cm$^{-3}$. The doping may be type n, as for the bottom portions.

In addition, in order to be porosifiable during PECE porosification, the material has a proportion of indium $x2>0$ sufficient to absorb the illumination light radiation in the pores. Note here that the absorption of the illumination light radiation by the top portions 14 can be based on the Franz-Keldysh, effect, as mentioned in particular in the article by Toguchi et al. entitled *Anisotropic Electrochemical Etching of Porous Gallium Nitride by Sub-Bandgap Absorption Due to Franz-Keldysh Effect*, J. Electrochem. Soc. 2019, 166, H510. This is because the central wavelength $\lambda_c$ is slightly less than the forbidden band energy of the material of the top portions 14, but the presence of an electrical field at the pores in formation allows absorption of the illumination light radiation. Thus the top portion 14 is porosified and not completely etched.

Moreover, each mesa $M_{(i)}$ of the growth substrate 10 can include an epitaxial regrowth portion 15 that rests on the top portion 14. It can be produced before the porosification of the mesas $M_{(i)}$, or after it, for example during the manufacture of the matrix of diodes $D_{(i)}$. It is made of a crystalline material based on InGaN that can be selected from InGaN and InAlGaN, and is intended to allow the production of the diodes $D_{(i)}$ by epitaxial regrowth. It is produced here by epitaxy from the top portions 14. Note that, if the epitaxial regrowth portion 15 is made of GaN, it can be deposited before or after the porosification of the mesas.

In the case where the epitaxial regrowth portions 15 are produced before the electrochemical porosification of the mesas $M_{(i)}$, it is made of a material that is non-porosifiable during ECE porosification and during PECE porosification.

Thus, to be non-porosifiable during ECE porosification, the material of the epitaxial regrowth portions 15 has a doping level $N_D$ lower than the minimum value $V_{D,min}$ ($V_{ECE}$) as from which the porosification of the material takes place. Preferably, the epitaxial regrowth portions 15 can be not intentionally doped (for example of the order of $10^{17}$ cm$^{-3}$) but are preferably weakly doped, and for example can have a doping level of no more than $5\times10^{17}$ cm$^{-3}$. The doping may be type n, as for the bottom portions.

In addition, to be non-porosifiable during PECE porosification, the material of the epitaxial regrowth portions 15 has a proportion of indium $x3$ such that the illumination light radiation is not absorbed. The proportion of indium $x3$ is lower than the proportion of indium $x2$ in the top portions 14. In the case where the epitaxial regrowth portions 15 are made of InGaN, they are preferably deposited after the porosification of the mesas, in order thus not to be constrained in terms of proportion of indium $x3$ with regard to PECE porosification.

In a variant, in the case where the epitaxial regrowth portions 15 are produced after the electrochemical porosification of the mesas $M_{(i)}$, it is of little importance whether or not they are made of a porosifiable material. Note that, in the latter case, the doped portions 31 of the semiconductor junction of the diodes $D_{(i)}$ can correspond to the epitaxial regrowth portions 15.

The epitaxial regrowth portions 15 have a thickness and a non-zero proportion of indium $x3$ such that it participates in obtaining the required degrees of relaxation $R_{(i)}$ for the mesas $M_{(1)}$ and $M_{(2)}$, as explained in detail below. By way of example, it has a thickness of approximately 200 nm and a proportion of indium $x3$ of at least 8%. It can have a smaller thickness, for example of approximately 100 nm, and a higher proportion of indium $x3$, for example approximately 12%.

Note here that the bottom 13 and top 14 portions (and the epitaxial regrowth portions 15, if they are produced before the electrochemical porosification) each have a thickness less than its critical thickness at which there is plastic relaxation of the mechanical stresses. The total thickness of the stack of these portions is also less than a predefined critical thickness. Thus the support layer 11 generates, in the bottom 13 and top 14 portions, mechanical stresses (oriented in the plane XY) the value of which is such that, before porosification, the mesh parameter at the top face of the mesas $M_{(i)}$ is close to or substantially equal to the effective mesh parameter $a^e_{cs}$ of the support layer 11.

Since the mesas $M_{(i)}$ are produced from the same initial crystalline stack 20, each portion of a mesa $M_{(i)}$ is coplanar with the corresponding portions of the other mesas. Thus the epitaxial regrowth portions 15 are coplanar with each other and define top faces that are also coplanar. The top portions 14 are coplanar with each other. The same applies to the bottom portions 13.

In addition, each portion of a mesa $M_{(i)}$ has a thickness identical to that of the corresponding portions of the other mesas. Thus the epitaxial regrowth portions 15 have the same thickness as each other. The same applies to the bottom portions 13, and to the top portions 14.

By way of illustration, in the example in FIG. 1A, the growth substrate 10 includes a buffer layer 12 of GaN constrained by the sapphire support layer 11 (mesh parameter here 3.184 Å). The mesas $M_{(i)}$ each include: a bottom portion 13 based on n-doped GaN, and a top portion of $In_{x2}Ga_{1-x2}N$ with $x2>0$. In this example, the epitaxial regrowth portion 15 is made of $In_{x3}Ga_{1-x3}N$ with a thickness of approximately 200 nm and a proportion of indium $x3$ of approximately 8%. It is produced before the electrochemical porosification of the mesas $M_{(i)}$.

The mesa $M_{(0)}$ has a minimum degree of relaxation $R_{(0)}$ so that the epitaxial regrowth portion 15 has a mesh parameter close to or substantially equal to that (3.184 Å) of the support layer 11. The mesa $M_{(2)}$ has a minimum degree of relaxation $R_{(2)}$ so that the epitaxial regrowth portion 15 has a mesh parameter close to or substantially equal to that of the solid $In_{0.15}Ga_{0.85}N$ (approximately 3.238 Å) that would have been deposited next on the mesa, because of the elastic deformation of the top 13 and bottom 14 porous portions. The mesa $M_{(1)}$ has an intermediate degree of relaxation $R_{(1)}$ so that the epitaxial regrowth portion 15 has a mesh parameter of between 3.184 Å and 3.217 Å. This therefore gives $a^e_{cre(0)} < a^e_{cre(1)} < a^e_{cre(2)}$. Thus the matrix of diodes can then include diodes $D_{(0)}$ emitting in the blue, diodes $D_{(1)u}$ emitting in the green, and diodes $D_{(N)}$ emitting in the red.

Thus the growth substrate 10 includes mesas of different categories $M_{(i)}$ having different porosification levels $P_{(i)}$, allowing different degrees of relaxation $R_{(i)}$. Such a growth substrate 10 then makes it possible to produce a matrix of diodes $D_{(i)}$ adapted to emit or receive, natively, light radiation at various wavelengths. This growth substrate 10 is obtained from an original crystalline stack 20 made of two bottom 23 and top 24 layers, in contact with each other, and not separated in pairs by an insulating layer. These various porosification levels are obtained by implementing a differentiated electrochemical porosification of the bottom 13 and top 14 portions of the mesas $M_{(i)}$. In this way the various categories of mesas $M_{(i)}$ are obtained, without its being necessary to implement steps of spatially localised implantation of dopants as in the manufacturing method of the prior art mentioned previously. The absence of an isolating layer in the mesas then makes it possible to electrically bias the diodes by the growth substrate 10.

FIGS. 3A to 3E illustrate various steps of a method for manufacturing a growth substrate 10 similar to the one in FIG. 1A, and then a matrix of diodes $D_{(i)}$. In this example, the diodes are electroluminescent and form an RGB native emission microscreen. The manufacturing method uses a PECE porosification of top portions 14 of the mesas $M_{(i)}$, followed by an ECE porosification of bottom portions 13.

Figures 3A, 3B, 3C, 3D, 3E:
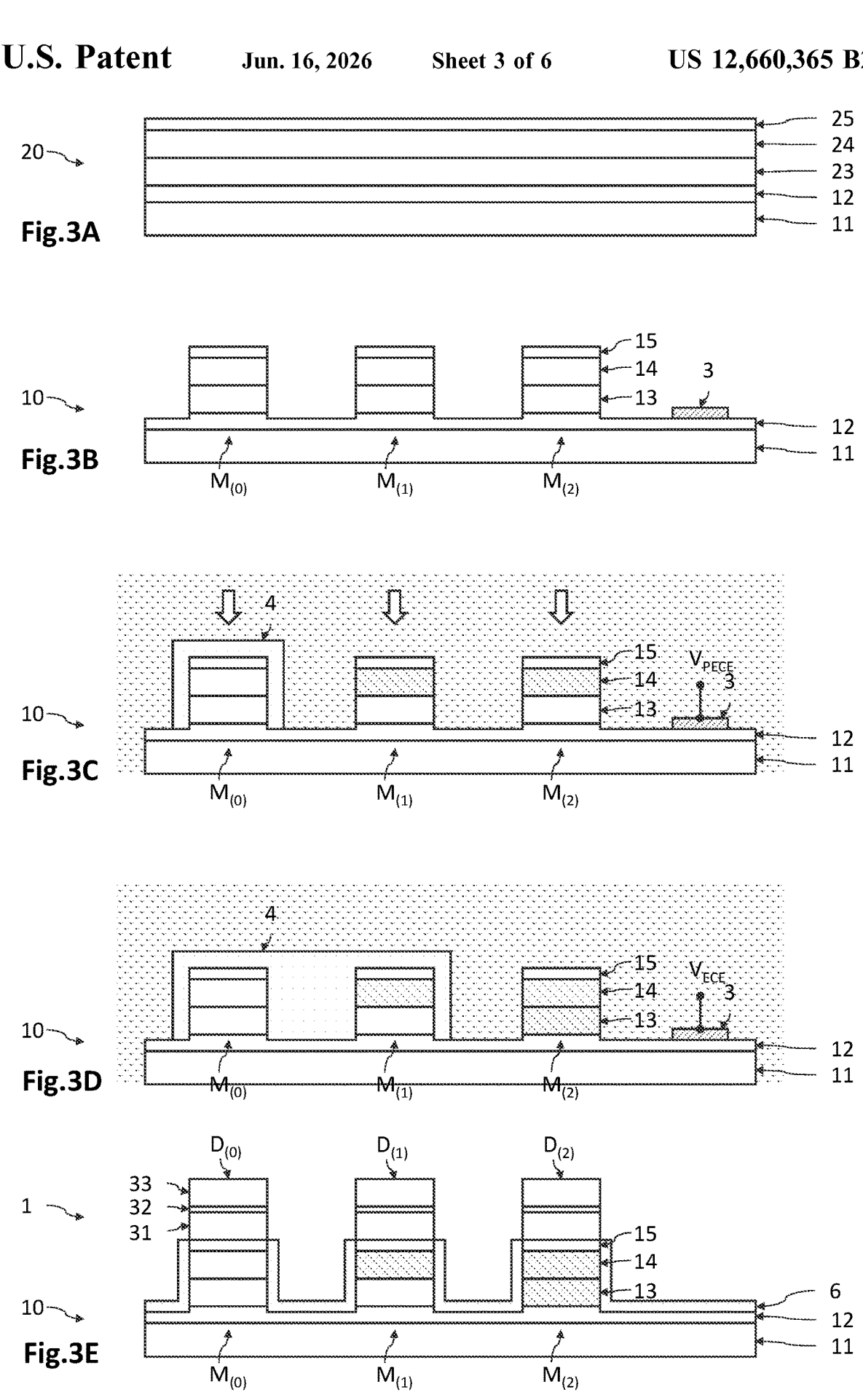
FIGS. 3A to 3E illustrate various steps of a method for manufacturing a growth substrate similar to the one in FIG. 1A, then a matrix of diodes, including a step of photoassisted electrochemical porosification (PECE) of the top portions followed by a step of non-photoassisted electrochemical porosification (ECE) of the bottom portions.

With reference to FIG. 3A, a crystalline stack 20 is first of all provided, including, on a support layer 11 that extends in the main plane XY: a buffer layer 12, a doped bottom continuous layer 23, a top continuous layer 24, and here a continuous epitaxial regrowth layer 25. These layers extend in the plane XY continuously over the entire extent of the support layer 11. The various layers are obtained by successive epitaxy steps from the support layer 11.

With reference to FIG. 3B, here a localised etching of the crystalline stack 20 is implemented so as to form the mesas $M_{(i)}$. Thus there are etched, preferably by dry etching, the continuous epitaxial regrowth layer 25 to form epitaxial regrowth portions 15, the top continuous layer 24 to form top portions 14, the bottom continuous layer 23 to form bottom portions 13, and to emerge here in the buffer layer 12. The bottom portions 13 are therefore distinct from each other in the plane XY (no continuity of material). The etching can in particular be implemented by a method of the chlorine-gas ICP-RIE plasma type. The mesas $M_{(i)}$ are therefore separated in pairs in the plane XY by a trench. Next an electrode 3 is deposited on and in contact with the buffer layer 12, which makes it possible to apply an electrical potential to the mesas $M_{(i)}$.

Note that, in a variant (not shown), the trench can separate the mesas $M_{(i)}$ from one category to another. On the other hand, the mesas in the same category can be separated in pairs by a less deep trench. They can thus be physically connected by a non-etched part of the bottom layer 23.

With reference to FIG. 3C, a first step of electrochemical porosification of the mesas $M_{(i)}$ is implemented. It is a case here of porosifying certain top portions 14 in a photoassisted manner. The bottom 23 and top 24 layers were configured in terms of proportion of indium (respectively x1 and x2) so that, during the PECE porosification where illumination light radiation of predefined central wavelength $\lambda_c$ is emitted in the direction of the mesas $M_{(i)}$, the top portions 14 can be porosified, whereas the bottom portions 13 are not porosified. In addition, in this example where the epitaxial regrowth portions 15 are produced before porosification, the material of these portions 15 was produced in terms of proportion of indium x3 so as not to be porosified during the PECE porosification.

But before that, for the purpose of obtaining mesas $M_{(0)}$ having a porosification level $P_{(0)}$, i.e. none of the bottom 13 and top 14 portions will be porosified during PECE and ECE porosifications, the mesas $M_{(0)}$ are encapsulated in an encapsulation layer 4 made of an electrically insulating material such as a photosensitive resin or a layer of a silicon oxide or nitride. Thus the bottom 13 and top 14 portions of the mesas $M_{(0)}$ will not be in contact with the liquid electrolyte. The encapsulation layer 4 can be transparent to the illumination light radiation: since the mesas $M_{(0)}$ will not be in contact with the liquid electrolyte, there will not be any PECE porosification. On the other hand, the mesas $M_{(1)}$ and $M_{(2)}$ are not covered by this encapsulation layer 4, so as then to be in contact with the liquid electrolyte.

Next the growth substrate is immersed in a liquid electrolyte. The biasing electrode 3 can be connected, or not, to the electrical generator. It makes it possible to collect the photogenerated electrons. Preferably, to improve the collection of these electrons, an electrical voltage of value $V_{PECE}$ is applied, which is sufficiently low not to generate ECE porosification, for example 1 to 2 V lower than the value $V_{ECE}$. The value of the electrical voltage $V_{PECE}$ can be reduced by adjusting the wavelength of the incident radiation. A reference electrode can be present to precisely control the electrical voltage applied. For this purpose, the biasing electrode 3 is connected to the anode of the electrical generator, the growth substrate 10 then forming a working electrode. A counter-electrode (here a platinum wire) is immersed in the electrolyte, and is connected to the cathode of the electrical generator. The electrical generator applies an electrical voltage $E_p$ of value $V_{PECE}$. The liquid electrolyte can be acidic or basic, and can be oxalic acid. It can also be KOH, HF, $HNO_3$, $NaNO_3$, $H_2SO_4$ or a mixture thereof. It is thus possible also to use a mixture of oxalic acid and $NaNO_3$.

In addition, an illumination light radiation is emitted, with a central wavelength $\lambda_c$, in the direction of the mesas $M_{(i)}$. Thus the illumination light radiation is absorbed by the top portions 14 of the mesas $M_{(1)}$ and $M_{(2)}$ at the pores (and not massively) to obtain porosification of the portions and not total etching of these. In this example, it can also be absorbed by the top portion of the mesas $M_{(0)}$ if the encapsulation layer 4 is transparent to the wavelength $\lambda_c$. Thus electron-hole pairs are photogenerated. The electrons are then collected by the biasing electrode 3, and the holes are used for oxidising the material of the top portions 14 of the mesas $M_{(1)}$ and $M_{(2)}$ that are in contact with the liquid electrolyte. Thus the top portions 14 of the mesas $M_{(1)}$ and $M_{(2)}$ are porosified in a photoassisted manner. On the other hand, the mesas $M_{(0)}$ are not porosified since they are not in contact with the liquid electrolyte. Note that the bottom portions 13 of the mesas $M_{(1)}$ and $M_{(2)}$ and the buffer layer 12 are not porosified since they are made of a material that is not porosifiable at the electrical voltage $V_{PECE}$. Once the top portions 14 of the mesas $M_{(1)}$ and $M_{(2)}$ are porosified, the growth substrate is removed from the electrolytic bath.

With reference to FIG. 3D, a second step of electrochemical porosification of the mesas $M_{(i)}$ is implemented. It is a case here of porosifying the bottom portions 13 of the mesas $M_{(2)}$ in a manner that is not photoassisted, without porosifying those of the mesas $M_{(1)}$. The bottom layer 23 was configured in terms of doping level so that, during the ECE porosification, the bottom portions 13 can be porosified if they are in contact with the liquid electrolyte.

Thus, for the purpose of preserving the mesas $M_{(1)}$ from a new porosification, and more precisely to avoid their bottom portions 13 being porosified, the mesas $M_{(1)}$ are encapsulated in the encapsulation layer (the same encapsulation layer 4 or a distinct encapsulation layer). Thus the mesas $M_{(1)}$ will not be in contact with the liquid electrolyte during the ECE porosification. On the other hand, the mesas $M_{(2)}$ are not covered by this encapsulation their 4, so as then to be in contact with the liquid electrolyte.

Next the growth substrate 10 is once again immersed in a liquid electrolyte. The biasing electrode is then connected to the electrical generator so as to apply an electrical voltage of value $V_{ECE}$. This results in a porosification of the bottom portions 13 of the mesas $M_{(2)}$ which alone are in contact with the liquid electrolyte. The bottom portions 13 of the mesas $M_{(1)}$ and $M_{(0)}$ are therefore not porosified. The electrical voltage applied between the anode and cathode can for example be between 1V and 100V. It can be applied for a period ranging from a few seconds to a few hours. A reference electrode can be present to precisely control the electrical voltage applied. Next the growth substrate 10 is removed from the electrolytic bath, and the encapsulation layer 4 is eliminated.

In this way a growth substrate 10 is obtained, including mesas $M_{(i)}$ having different degrees of porosification $P_{(i)}$, and formed from the same original crystalline stack 20. Since the epitaxial regrowth portions 15 are present, there is also relaxation of the mesas, so that they have various degrees of relaxation $R_{(i)}$. This relaxation of the mechanical stresses differentiated from one category of mesa to another is obtained by differentiated electrochemical porosification of the mesas $M_{(i)}$. These mesas $M_{(i)}$ all have an epitaxial regrowth portion 15 made of $In_xGa_{1-x}N$ with the same proportion of indium x3, but with a different relaxation depending on whether the various categories of mesa $M_{(i)}$ are considered. They are therefore adapted to the production by epitaxy of a matrix of diodes $D_{(i)}$ making it possible to emit or receive light radiation at various wavelengths.

With reference to FIG. 3E, the matrix of diodes $D_{(i)}$ is next manufactured, by epitaxial regrowth from the mesas $M_{(i)}$ of the growth substrate 10. In this example, the diodes are electroluminescent. Here diodes $D_{(0)}$ are produced from the mesas $M_{(0)}$, diodes $D_{(1)}$ are produced from the mesas $M_{(1)}$, and diodes $D_{(2)}$ are produced from the mesas $M_{(2)}$.

For this purpose, the biasing electrode 3 can be removed, and then an insulating layer 6 deposited (growth mask), here in a standard manner, so as to cover the buffer layer 12 and the flanks of the mesas $M_{(i)}$. Only the top surfaces of the mesas $M_{(i)}$ are made free, so as to form a germination surface. The insulating layer 6 is made of an electrically insulating material, and can be a silicon oxide or nitride 80 nm thick deposited by plasma assisted chemical vapour deposition (PECVD).

The diodes $D_{(i)}$ are produced simultaneously, by epitaxial regrowth from epitaxial regrowth portions 15 of the various mesas $M_{(i)}$. There are thus formed:

diodes $D_{(0)}$, from the mesas $M_{(0)}$, adapted to emit at a principal wavelength $\lambda_0$, for example a blue light the wavelength $\lambda_0$ of which is for example between approximately 440 nm and approximately 490 nm;

diodes $D_{(1)}$, from the mesas $M_{(1)}$, adapted to emit at a principal wavelength $\lambda_1$, for example a green light the wavelength $\lambda_1$ of which is for example between approximately 495 nm and approximately 560 nm;

diodes $D_{(2)}$, from the mesas $M_{(2)}$, adapted to emit at a principal wavelength $\lambda_2$, for example a red light the wavelength $\lambda_2$ of which is for example between approximately 600 nm and approximately 650 nm.

This is possible through the fact that the epitaxial regrowth portions 15 of the mesas $M_{(0)}$, $M_{(1)}$ and $M_{(2)}$ have an effective mesh parameter different from one category of mesa to another, because of the different degrees of relaxation $R_{(0)}$, $R_{(1)}$ and $R_{(2)}$. Thus, incorporating indium in the diodes, and in particular in the quantum wells of the active layers 32, depends in fact on the effective mesh parameter (and therefore on the degree of relaxation) of the epitaxial regrowth portions 15 of the various mesas. The higher the effective mesh parameter of an epitaxial regrowth layer 15, the longer the principal wavelength of the corresponding diode.

The diodes $D_{(i)}$ include at a minimum two doped portions 31, 33, one type n and the other type p, and an intermediate active layer 32 including quantum wells. The doped layer 31, 33 and the active portion 32 can be multilayers (and thus the quantum wells are conventionally located between barrier sublayers) and include other layers or sublayers such as an electron-blocking layer.

Moreover, the method for manufacturing the matrix of diodes also includes a step of producing biasing electrodes of the diodes $D_{(i)}$. This step is conventional and is not described here. In the case where the mesas $M_{(i)}$ are electrically conductive, they can be taken advantage of to bias the diodes. Thus the biasing electrode 3 can be kept.

In this way an optoelectronic device 1 is obtained, the diodes $D_{(i)}$ which are here adapted to natively emit at various wavelengths, here in the three colours RGB, this by virtue of the growth substrate 10 the mesas $M_{(i)}$ of which at various porosification levels $P_{(i)}$ were produced by differentiated electrochemical porosification, without having had recourse to steps of spatially localised implantation of dopants, and which made it possible to produce the diodes $D_{(i)}$ using a single epitaxial regrowth step.

Figures 4A, 4B, 4C, 4D, 4E:
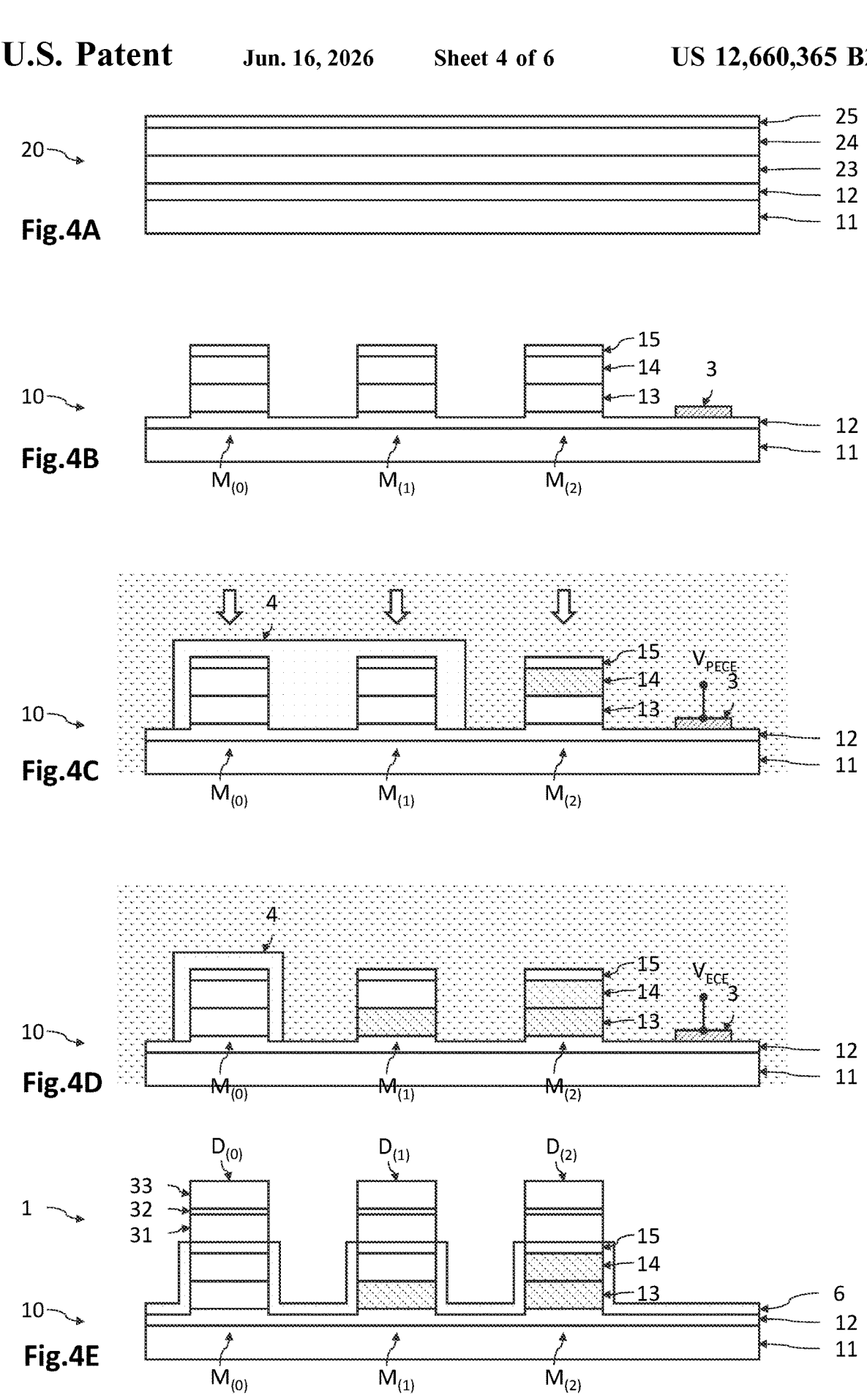
FIGS. 4A to 4E illustrate various steps of a method for manufacturing a growth substrate similar to the one in FIG. 1B, then a matrix of diodes, also including a step of photoassisted electrochemical porosification PECE followed by a step of non-photoassisted electrochemical porosification ECE.

FIGS. 4A to 4E illustrate various steps of a method for manufacturing a growth substrate 10 similar to the one in FIG. 1B, and then a matrix of diodes $D_{(i)}$. The manufacturing method also uses a PECE porosification of top portions 14 of the mesas $M_{(i)}$, followed by an ECE porosification of bottom portions 13. The steps in FIG. 4A, FIG. 4B and FIG. 4E are identical or similar to those in FIG. 3A, FIG. 3B et FIG. 3E: they are not described again.

With reference to FIG. 4C, a first step of electrochemical porosification of the mesas $M_{(i)}$ is implemented. It is a case here of porosifying, in a photoassisted manner, the portion 14 solely of the mesas $M_{(2)}$, and not those of the mesas $M_{(1)}$. Thus the encapsulation layer 4 covers the mesas $M_{(0)}$ and the mesas $M_{(1)}$. Thus only the mesas $M_{(2)}$ are not covered by the encapsulation layer 4 and will be in contact with the liquid electrolyte.

Next the growth substrate 10 is immersed in the liquid electrolyte. The biasing electrode 3 can be connected, or not, to the electrical generator. The illumination light radiation is emitted in the direction of the mesas $M_{(i)}$. Thus the illumination light radiation is absorbed by the top portion 14 of the mesas $M_{(2)}$. Thus the top portion 14 of the mesas $M_{(2)}$ is porosified in a photoassisted manner. On the other hand, the top portions 14 of the mesas $M_{(0)}$ and $M_{(1)}$ are not porosified since they are not in contact with the liquid electrolyte. The buffer layer 12 is here not porosified since it is made of a material that is not porosifiable at the electrical voltage $V_{PECE}$. Once the top portions 14 of the mesas $M_{(2)}$ are porosified, the growth substrate is removed from the electrolytic bath.

With reference to FIG. 4D, the second step of electrochemical porosification of the mesas $M_{(i)}$ is implemented. It is a case here of porosifying the bottom portions 13 of the mesas $M_{(1)}$ and $M_{(2)}$ in a manner that is not photoassisted, without porosifying those of the mesas $M_{(0)}$. For this purpose, the part of the encapsulation layer 4 that covers the mesas $M_{(1)}$ is removed and the part that covers the mesas $M_{(0)}$ is kept.

Next the growth substrate 10 is once again immersed in a liquid electrolyte. The biasing electrode 3 is then connected to the electrical generator so as to apply an electrical voltage of value $V_{ECE}$. This results in a porosification of the bottom portions 13 of the mesas $M_{(1)}$ and $M_{(2)}$, which are in contact with the liquid electrolyte. The mesas $M_{(0)}$ are not porosified. Next the growth substrate is removed from the electrolytic bath, as well as the encapsulation layer 4. In this way a growth substrate 10 is obtained similar to the one in FIG. 1B where the mesas $M_{(1)}$ include a porosified bottom portion 13 and a non-porosified top portion 14.

Figure 5A:
FIGS. 5A to 5D illustrate various steps of a method for manufacturing a growth substrate similar to the one in FIG. 1B, then a matrix of diodes, wherein the bottom portions and top portions are porosified concomitantly.
Figure 5B:
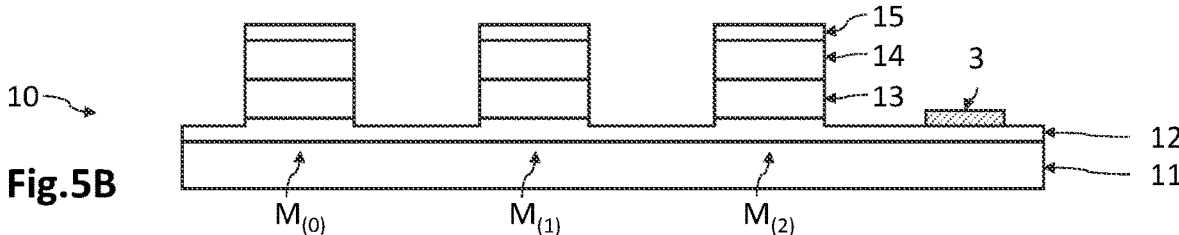
Figure 5C:
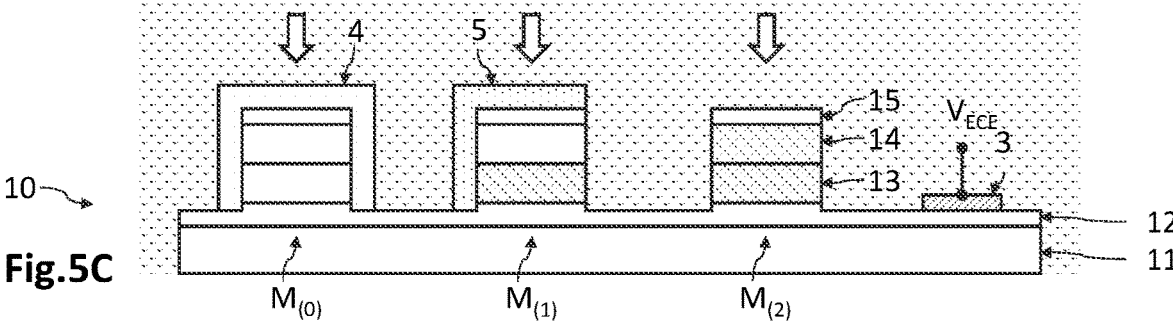
Figure 5D:
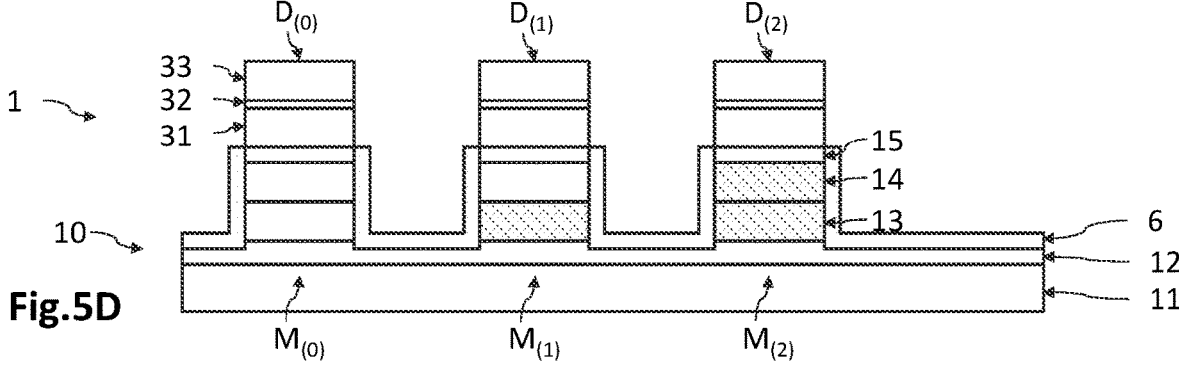

FIGS. 5A to 5D illustrate various steps of a method for manufacturing a growth substrate 10 similar to the one in FIG. 1B, and then a matrix of diodes $D_{(i)}$. The manufacturing method also uses a PECE porosification of top portions 14 of the mesas and an ECE porosification of bottom portions 13, these porosifications being implemented during the same step. The steps in FIG. 5A, FIG. 5B and FIG. 5D are identical or similar to those in FIG. 3A, FIG. 3B et FIG. 3E: they are not described again.

With reference to FIG. 5C, the PECE and ECE porosifications of the mesas $M_{(1)}$ and $M_{(2)}$ are implemented during the same step, i.e. during the same immersion in the electrolytic bath. It is a case here of porosifying, in a photoassisted manner, the top portion 14 solely of the mesas $M_{(2)}$, and not those of the mesas $M_{(1)}$, and porosifying in a non-photoassisted manner the bottom portions 13 of the mesas $M_{(1)}$ and $M_{(2)}$.

For this purpose, the mesas $M_{(0)}$ are covered with an encapsulation layer 4 made of an electrically insulating material (opaque or not). In addition, the mesas $M_{(1)}$ are partially covered with an encapsulation layer 5 made of a material opaque to the illumination light radiation. An opaque material is a material the transmission factor of which at the wavelength $\lambda_c$ is zero or almost zero. The opaque encapsulation layer 5 does not partially cover the mesas $M_{(1)}$ in that a part of the flanks of the bottom portion 13 is left free, while at least partially covering the top surface of the mesa $M_{(1)}$, or even the whole of it.

Next the growth substrate 10 is immersed in the liquid electrolyte. The biasing electrode 3 is then connected to the electrical generator so as to apply an electrical voltage of value $V_{ECE}$. In addition, the illumination light radiation is emitted in the direction of the mesas $M_{(i)}$. It is possible for $V_{ECE}$ to be the same for the ECE and PECE porosification, but, as the proportions of indium are different, it is also possible to use a lower voltage $V_{ECE}$ during the PECE porosification and then increase $V_{ECE}$ for the ECE porosification.

Illumination of the mesas $M_{(i)}$ leads to a PECE porosification of the top portion 14 of the mesas $M_{(2)}$ since only this top portion 14 is in contact with the liquid electrolyte and absorbs the illumination light radiation. On the other hand, the top portion 14 of the mesas $M_{(1)}$, although it is also in contact with the liquid electrolyte, is protected from the illumination light radiation by the opaque encapsulation layer 5: it is substantially not (or little) porosified. Finally, the top portion 14 of the mesas $M_{(0)}$ is not in contact with the liquid electrolyte: it is not porosified.

In addition, applying the electrical voltage $E_p$ of a value $V_{ECE}$ leads to a porosification of the bottom portions 13 of the mesas $M_{(1)}$ and $M_{(2)}$, which alone are in contact with the liquid electrolyte. The mesas $M_{(0)}$ are not porosified.

Next the growth substrate is removed from the electrolytic bath, as well as the encapsulation layers 4 and 5. In this way a growth substrate 10 is obtained similar to the one in FIG. 1B where the mesas $M_{(1)}$ and $M_{(2)}$ were porosified by ECE and ECE porosification. The diodes can then be produced (FIG. 5D).

FIGS. 6A to 6D illustrate various steps of a method for manufacturing a growth substrate 10 similar to the one in FIG. 1C, and then a matrix of diodes $D_{(i)}$. The manufacturing method also uses PECE and ECE porosifications implemented during the same step, although a porosification in two steps remains possible.

Figure 6A:
FIGS. 6A to 6D illustrate various steps of a method for manufacturing a growth substrate similar to the one in FIG. 1C, then a matrix of diodes, wherein the bottom portions and top portions are porosified concomitantly.

With reference to FIG. 6A, a crystalline stack 20 is first of all provided. This is identical to the one in FIG. 3A, except that it does not include the buffer layer 12 or the continuous epitaxial regrowth layer 25.

Figure 6B:
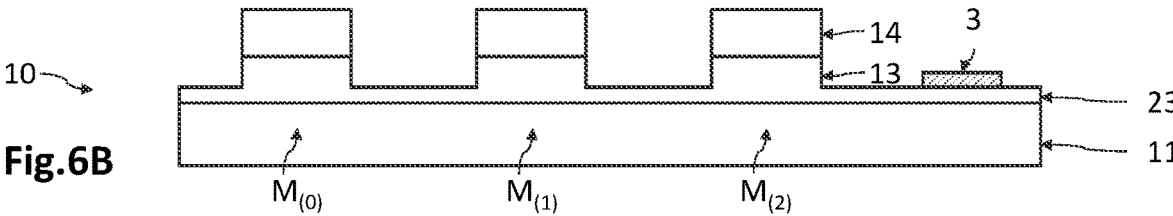

With reference to FIG. 6B, the mesas $M_{(i)}$ are produced by localised etching of the crystalline stack 20. The trenches are produced, which emerge in the bottom continuous layer 23. They could emerge on the support layer 11 if it were made of an electrically conductive (non-porosifiable) material. The biasing electrode 3 would then be deposited in contact with the bottom layer 11. On the other hand, in this example, the support layer 11 is made of sapphire, so that the bottom continuous layer 23 is not etched over the entire thickness thereof. A non-etched part connects the bottom portions 13 to each other and provides the electrical connection to the biasing electrode 3.

Figure 6C:
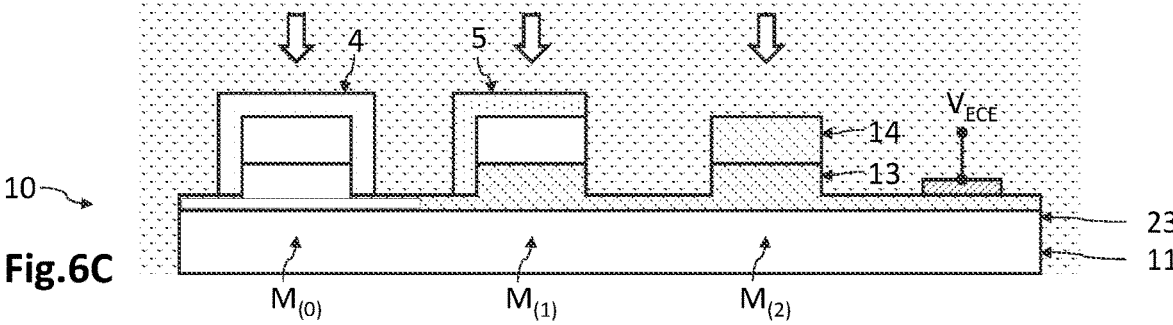

With reference to FIG. 6C, the PECE and ECE porosifications of the mesas $M_{(1)}$ and $M_{(2)}$ are implemented during the same step. This is identical to the one in FIG. 5C and is therefore not described again in detail. We note only that, during the ECE biasing, the connection part of the bottom continuous layer 23 is also porosified at the same time as the bottom portions 13. The part of the bottom continuous layer 23 that is distant from the biasing electrode 3 may not be porosified since the series electrical resistance may be too high.

Figure 6D:
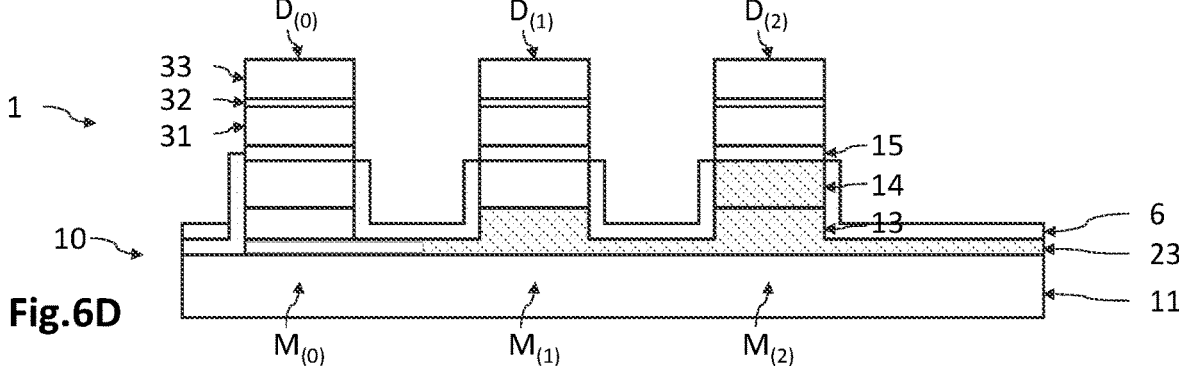

With reference to FIG. 6D, the growth substrate 10 is next removed from the electrolytic bath, and the encapsulation layers 4, 5 are eliminated. The mesas $M_{(i)}$ have various porosification levels $P_{(i)}$, but may not yet have the degrees of relaxation $R_{(i)}$ required since the epitaxial regrowth portions 15 are not yet produced. After a growth mask 6 (isolating layer) has been deposited, the epitaxial regrowth portions 15 are then produced, from the top surfaces of the top portions 14.

A thin layer based on GaN, and preferably made of InGaN with a proportion of indium of approximately 1%, with a thickness of between approximately 10 and approximately 100 nm, can be produced by epitaxy. This thin layer is produced on and in contact with the top portions 14 of the mesas $M_{(i)}$, and closes off the pores emerging at the top face. Next, it is possible to produce by epitaxy the epitaxial regrowth portions 15 at each mesa $M_{(i)}$. These portions 15 can have a thickness of approximately 200 nm and a proportion of indium of the order of approximately 8%. They then cause the deformation of the porous portions of the mesas $M_{(1)}$ and $M_{(2)}$, which in return enable the portions 15 to relax. The doped portions 31, 33 and the active portion 32 of the diodes are next produced. Note here that the doped portion 31 of the diodes $D_{(i)}$ can then serve as an epitaxial regrowth portion 15.

Particular embodiments have just been described. Various variations and modifications will appear to a person skilled in the art.

The invention claimed is:

1. A method for manufacturing a growth substrate configured to produce by epitaxy a matrix of diodes based on InGaN, including the following steps:

providing a crystalline stack based on GaN, including: a doped bottom layer; and a top layer produced from $In_{x2}Ga_{1-x2}N$ with x2>0, resting on and in contact with the doped bottom layer; where:

the doped bottom layer has a proportion of indium x1≥0 predefined so that it is non-adsorbent of an illumination light radiation having a predefined central wavelength, and the top layer has a proportion of indium x2>0 predefined so that it is absorbent of the illumination light radiation;

the doped bottom layer has a doping level predefined so that it is porosifiable at an electrical voltage of predefined value $V_{ECE}$, and the top layer (24) has a doping level predefined so that it is non-porosifiable at the predefined electrical voltage $V_{ECE}$;

producing mesas $M_{(i)}$, with i ranging from 0 to 2, by localised etching of the top layer to form top portions of mesas and of at least part of the doped bottom layer to form bottom portions of mesas; then depositing an encapsulation layer made of an electrically insulating material, covering at least one mesa denoted $M_{(0)}$, so that said mesa $M_{(0)}$ is not porosified during an electrochemical porosification of mesas denoted $M_{(1)}$ and $M_{(2)}$; then electrochemical porosification of the bottom and top portions of at least one mesa $M_{(2)}$ by: photoassisted porosification of the top portion of the mesa $M_{(2)}$ by emission of the illumination light radiation; and non-photoassisted of the bottom portion of the mesa $M_{(2)}$ by applying the electrical voltage of value $V_{ECE}$;

electrochemical porosification of only one of the bottom and top portions of at least one mesa $M_{(1)}$ by: photoassisted porosification of the top portion of the mesa $M_{(1)}$ during that of the top portion of the mesa $M_{(2)}$; or non-photoassisted of the bottom portion of the mesa $M_{(1)}$ during that of the bottom portion of the mesa $M_{(2)}$;

at least partial removal of the encapsulation layer, so as to make free a top surface of the mesa $M_{(0)}$.

2. The manufacturing method according to claim 1, wherein the photoassisted porosification and the non-photoassisted porosification are implemented during distinct steps.

3. The manufacturing method according to claim 2, including the following distinct steps:

a step of photoassisted porosification of the top portions of the mesas $M_{(1)}$ and $M_{(2)}$, the mesas $M_{(1)}$ and $M_{(2)}$ being in contact with a liquid electrolyte;

a step of non-photoassisted porosification of the bottom portion of the mesas $M_{(2)}$, the mesas $M_{(1)}$ being covered with an encapsulation layer produced from an electrically insulating material, only the mesas $M_{(2)}$ being in contact with a liquid electrolyte.

4. The manufacturing method according to claim 2, including the following distinct steps:

a step of photoassisted porosification of the top portion of the mesas $M_{(2)}$, the mesas $M_{(1)}$ being covered with an encapsulation layer made of an electrically insulating material, only the mesas $M_{(2)}$ being in contact with a liquid electrolyte;

a step of non-photoassisted porosification of the bottom portion of the mesas $M_{(1)}$ and $M_{(2)}$, the mesas $M_{(1)}$ and $M_{(2)}$ being in contact with a liquid electrolyte.

5. The manufacturing method according to claim 1, wherein the photoassisted porosification and the non-photoassisted porosification are implemented during the same step, an opaque encapsulation layer, made of a material opaque to the illumination light radiation, at least partly covering a top surface of the mesas $M_{(1)}$ while leaving free a lateral surface of the bottom portion of the mesas $M_{(1)}$.

6. The manufacturing method according to claim 1, wherein the crystalline stack includes a continuous epitaxial regrowth layer, resting on the top layer, and made from InGaN having a proportion of indium x3>0 predefined so that it is non-absorbent of the illumination light radiation, and having a doping level predefined so that it is non-porosifiable at the predefined electrical voltage $V_{ECE}$.

7. The manufacturing method according to claim 1, wherein the crystalline stack does not include a continuous epitaxial regrowth layer, so that the top layer has a free top face, epitaxial regrowth portions made from InGaN being produced as from a top surface of the top portions of the mesas $M_{(1)}$ after the porosification of the mesas $M_{(1)}$ and $M_{(2)}$.

8. The manufacturing method according to claim 1, wherein, during the photoassisted porosification, an electrical voltage is applied between the growth substrate and a liquid electrolyte in which it is immersed, of a value $V_{PECE}$ predefined so that the bottom portions of the mesas $M_{(1)}$ are not porosified.

9. A method for manufacturing an optoelectronic device, including the following steps:

manufacturing the growth substrate by the method according to claim 1; then manufacturing a matrix of diodes $D_{(i)}$ by epitaxy from the mesas $M_{(i)}$ of the growth substrate, the diodes then being adapted to emit or detect a light radiation at various wavelengths, the wavelength being different from one category of mesa $M_{(i)}$ to another.

10. A growth substrate configured to produce by epitaxy a matrix of diodes based on InGaN, including:

a support layer;

mesas $M_{(i)}$, with i ranging from 0 to 2, made from crystalline GaN, resting on the support layer, and each including: a doped bottom portion having a proportion of indium x1≥0; and a top portion made from $In_{x2}Ga_{1-x2}N$ with a proportion of indium x2>x1 and having a doping level less than that of the bottom portion, and resting on and in contact with the bottom portion; the mesas being configured so that:

the bottom and top portions of the mesa $M_{(0)}$ are non-porous;

only one portion among the bottom and top portions of the mesa $M_{(1)}$ is porous;

the bottom and top portions of the mesa $M_{(2)}$ are porous.

11. The growth substrate according to claim 10, wherein each mesa $M_{(i)}$ includes an epitaxial regrowth portion resting on the top portion, made from non-porous crystalline InGaN the mesh parameter $a^m_{cre}$ of the relaxed material of which is greater than the effective mesh parameter $a^e_{cs}$ of the support layer:

the epitaxial regrowth portion of each mesa $M_{(2)}$ having a maximum mesh parameter $a^e_{cre(2)}$;

19 the epitaxial regrowth portion of each mesa $M_{(0)}$ having a mesh parameter $a^e_{cre(0)}$ less than $a^e_{cre(2)}$;

the epitaxial regrowth portion of each mesa $M_{(1)}$ having an intermediate mesh parameter $a^e_{cre(1)}$ less than $a^e_{cre(2)}$ and different from $a^e_{cre(0)}$.

12. The growth substrate according to claim 10, wherein the bottom portions of the mesas $M_{(i)}$ rest on a continuous layer made of an electrically conductive material.

13. An optoelectronic device including: a growth substrate according to claim 10; and a matrix of diodes $D_{(i)}$ based on InGaN, epitaxed from the mesas of the growth substrate, the diodes then being adapted to emit or detect a light radiation at various wavelengths, the wavelength being different from one category of mesa $M_{(i)}$ to another.

* * * * *